United States Patent [19]

Yoshinari et al.

[11] Patent Number: 5,611,670
[45] Date of Patent: Mar. 18, 1997

[54] BLADE FOR GAS TURBINE

[75] Inventors: Akira Yoshinari, Katsuta; Hideki Tamaki, Hitachi; Tosiaki Saito, Katsuta; Mitsuru Kobayashi, Hitachiota; Katsumi Iijima; Katsuo Wada, both of Hitachi; Kimio Kano; Hiroyuki Matsuzaki, both of Sendai, all of Japan

[73] Assignees: Hitachi, Ltd., Tokyo; Tohoku Electric Power Co., Inc., Miyagi-ken, both of Japan

[21] Appl. No.: 280,992

[22] Filed: Jul. 27, 1994

[30] Foreign Application Priority Data

Aug. 6, 1993 [JP] Japan .................... 5-195795

[51] Int. Cl.$^6$ .................................................. F01D 5/14
[52] U.S. Cl. ................... 416/241 R; 148/404; 148/902; 164/122.1; 164/122.2
[58] Field of Search ................. 416/241 R; 420/446, 420/447, 448; 148/410, 404, 428, 902; 164/122.2, 122.1

[56] References Cited

U.S. PATENT DOCUMENTS

| | | | |
|---|---|---|---|
| 3,568,757 | 3/1971 | Piearcey . | |
| 3,844,728 | 10/1974 | Copley et al. | 164/122.2 |
| 4,033,792 | 7/1977 | Giamei et al. | 148/428 |
| 4,184,900 | 1/1980 | Erickson et al. | 148/404 |
| 4,190,094 | 2/1980 | Giamei | 164/122.1 |
| 4,609,029 | 9/1986 | Vishnevsky et al. | 164/122.1 |
| 4,637,448 | 1/1987 | Burke et al. | 164/122.2 |

FOREIGN PATENT DOCUMENTS

| | | | |
|---|---|---|---|
| 45563 | 2/1982 | European Pat. Off. | 148/404 |
| 0059550 | 9/1982 | European Pat. Off. . | |
| 0176258 | 4/1986 | European Pat. Off. . | |
| 0413439 | 2/1991 | European Pat. Off. . | |
| 0475428 | 3/1992 | European Pat. Off. . | |
| 2374427 | 7/1978 | France . | |
| 51-4186 | 2/1976 | Japan . | |
| 60-261659 | 12/1985 | Japan . | |
| 61-71168 | 4/1986 | Japan . | |
| 2234521 | 2/1991 | United Kingdom . | |

OTHER PUBLICATIONS

Journal of Materials Engineering and Performance, vol. 2, No. 4, Aug. 1993, Materials Park, Ohio, U.S., pp. 481–487, by K. Harris et al, entitled "Development of Two Rhenium--Containing Supperalloys for single–Crystal Blade and Directionally solidified Vane Applications in Advanced Turbine Engines".

Primary Examiner—James Larson
Attorney, Agent, or Firm—Antonelli, Terry, Stout & Kraus, LLP

[57] ABSTRACT

A gas-turbine moving blade made of a Ni-base superalloy containing less grain boundary strengthening elements, in which a blade portion is formed of a single crystal and the rest is formed of columnar crystals, and a gas turbine including the moving blade. A thermal efficiency of the gas turbine can be improved to 35% or more, and a thermal efficiency of complex power generation with a steam turbine can be improved to 45% or more.

13 Claims, 7 Drawing Sheets

BLADE FOR GAS TURBINE

TECHNICAL BACKGROUND OF THE INVENTION

FIELD OF THE INVENTION

The present invention relates to a novel blade for a gas turbine and, more particularly, to the blade having an excellent creep strength, a manufacturing method of the blade, and a gas turbine including the blades.

BACKGROUND OF THE INVENTION

Conventionally, blades of a gas turbine for power generation have been mainly made of a Ni-base superalloy. However, in order to improve the thermal efficiency of the gas turbine, the temperature of the combustion gas has been yearly increased. Accordingly, to enhance a heat resistance of the blade, materials for the blade have been shifted from equiaxed structure by conventional casting to columnar grain metal structure by unidirectional solidification, and also, internal cooling of the blade has been attempted by forming a complicated cooling hole inside of the blade.

Most of columnar grain structure castings are manufactured by a unidirectional solidification method disclosed, for example, in JP-B-51-4186. In the method, a mold is withdrawn downwardly from a heated furnace so as to effect gradual solidification upwardly from the lower end. According to the method, a blade having columnar grains of a crystal orientation of <100>, which are elongated in the longitudinal direction in which the centrifugal stress acts, has been manufactured to thereby improve the creep strength property and thermal fatigue strength property.

As a blade which is more excellent in high temperature properties than the columnar grain blade, manufacturing methods of blades for combustion turbines each comprising a blade portion of a single crystal and a root portion of fine grains are disclosed in, for example, JP-A-60-261659 and JP-A-61-71168.

In order to further enhance the efficiency, it is the most effective method to increase the combustion gas temperature. For this purpose, the internal cooling must be improved, and the high-temperature strength of the material must be also increased.

An inner cooling hole of a blade of a gas turbine is formed by use of a ceramic core. Conventionally, it has been tried to provide the blade with an increased number of cooling paths and reduce the wall thickness of the blade portion of the blade in order to further improve the cooling capacity or efficiency of the blade. The blade of a columnar crystal structure is manufactured by the unidirectional solidification method, wherein molten metal is solidified with a core incorporated therein, and then the blade is cooled to a room temperature. During cooling, thermal contraction occurs. When coefficients of thermal expansion of the core and the casting metal are compared, the core exhibits a value about 1/10 that of the metal. Consequently, the metal contracts while the core, which hardly contracts, is kept inside of the metal, resulting in generation of a large tensile stress in the casting during cooling. Therefore, the casting is apt to have cracks in the longitudinal direction along grain boundaries which have low strength. Cracks in the longitudinal direction are particularly caused in a thin blade portion. For this reason, the blade portion of the conventional columnar grain blade can not be reduced in thickness, so that it can not be sufficiently cooled. Moreover, intergranular cracks are generated during casting thereby reducing the yield of blades.

A blade for use in an aircraft jet engine has a length of about 10 cm at the maximum and a weight of several hundred grams, and therefore, it can be easily single-crystallized. However, a blade for use in a gas turbine for power generation not only has a complicated configuration but also is extremely large and has a length of 15 to 40 cm and a weight of several kilogram to about 10 kg. Therefore, according to the method disclosed in, for example, JP-B-51-4186, single-crystallization is extremely difficult because irregular grains and freckle defects are easily generated.

JP-A-60-261659 and JP-A-61-71168 disclose the manufacturing methods in which a blade portion is formed of a single crystal structure, and the remaining blade portion is formed of fine grains by utilizing magnetic stirring. However, when a conventional single crystal alloy is cast by these methods, a problem arises in that the strength of the portion of fine grains is low. Moreover, when an alloy containing a large amount of grain boundary strengthening elements is used for casting to maintain a certain strength of the portion of fine grains, the melting point of eutectic structure and eutectic γ'-phase formed during solidification is reduced, so that solution treatment can not be fully effected. As a result, the strength of the material can not be improved.

As described above, problems encountered with the blades constructed according to the prior art are that intergranular cracks are easily generated when a thickness of the blade is reduced to improve the cooling efficiency, and the strength of the blade can not be improved when grain boundary strengthening elements are added to prevent intergranular cracking. Therefore, it has been impossible to enhance the efficiency of the gas turbine.

Moreover, a single crystal blade which is excellent in high-temperature strength has an extremely low yield because irregular grains are easily formed. Further, since a large-size blade of a single crystal can not be manufactured, principles relating to a single crystal blade can not be applied to blades of a gas turbine for power generation. Therefore, it has been impossible to enhance the efficiency of the gas turbine.

SUMMARY OF THE INVENTION

An objective of the present invention resides in providing a columnar grain blade for a gas turbine which causes no intergranular cracking during the casting process and which has an excellent creep strength, a manufacturing method of the same, and a gas turbine including the blades.

A blade for a gas turbine according to the present invention has a blade portion with a single crystal structure region, with the rest of the blade other than the single crystal structure region including the blade portion being of unidirectionally solidified columnar grain structure. It is preferred that the blade for the gas turbine according to the invention should have a polycrystal portion of a columnar grain structure whose longitudinal orientations are within 15° from the <100> orientation, and that a difference of crystal orientations of adjacent columnar grain should be 8° or less.

The blade for the gas turbine according to the invention is a casting of a Ni-base superalloy containing, by weight, one or more elements of 0.03% or more carbon, 0.005% or more boron and 0.005% or more Zr, in which precipitated γ'-phase can be dissolved into the γ-phase without incipient melting due to local melting at grain boundaries of the alloy. The alloy containing 0.05 to 0.1% carbon, and 0.005 to 0.025% one or both of boron and Zr is suitable for preventing cracking.

The blade for the gas turbine of the invention is a casting of a Ni-base superalloy having the following suitable composition by weight %.

The casting essentially consists of, by weight, up to 0.20% C, 5 to 14% Cr, 4 to 7% Al, 2 to 15% W, 0.5 to 5% Ti, up to 3% Nb, up to 6% Mo, up to 12% Ta, up to 10% Co, up to 2% Hf, up to 4% Re, up to 0.035% B, up to 0.035% Zr, and the balance of 58% or more Ni.

The present invention provides a blade for a gas turbine, which is formed of an integral casting and which comprises a blade portion, a platform having a flat portion connected to the blade portion, a shank portion connected to the platform, projection fins on both sides of the shank portion, and a dovetail connected to the shank portion, wherein the blade portion including its root portion connected to the platform, the platform and a part of the shank portion are of a continuous single crystal structure, and wherein the rest of the blade except for the fins is of a unidirectionally solidified columnar grains structure.

The invention further provides a blade for a gas turbine, which is formed of an integral casting and which comprises a blade portion, a platform having a flat portion connected to the blade portion, a shank portion connected to the platform, projection fins on both sides of the shank portion, and a dovetail connected to the shank portion, wherein the blade portion including its root portion connected to the platform, the platform and a part of the shank portion are of a continuous single crystal structure, and wherein the rest of the blade is of a unidirectionally solidified columnar grains structure.

The blade of the invention includes an integral continuous coolant passage.

The invention provides a blade for a gas turbine, essentially consisting of, by weight, up to 0.20% C, 5 to 14% Cr, 4 to 7% Al, 2 to 15% W, 0.5 to 5% Ti, up to 3% Nb, up to 6% Mo, up to 12% Ta, up to 10% Co, up to 2% Hf, up to 4% Re, up to 0.035% B, up to 0.035% Zr, and the balance of 58% or more Ni, in which one or both of the carbon content and the boron and Zr content are within a range defined by A (C=0.20% B+Zr=0%), B (C=0.05 B+Zr=0%), C (C=0% B+Zr=0.01%), D (C=0% B+Zr=0.035%) and E (C=0 1% B+Zr=0.025%), and a difference of crystal orientations is 2 to 8degrees.

The invention provides a blade for a gas turbine, wherein the blade essentially consists of, by weight, 0.03 to 0.1% C, 5.5 to 7.0% Cr, 8.5 to 9.5% Co, 8 to 9% W, 2.5 to 3.5% Re, 0.3 to 1.0% Mo, 3 to 4% Ta, 5 to 6% Al, 0.5 to 1.0% Ti, 0.5 to 1.0% Hf, 0.005 to 0.025% one or both of boron and Zr, and the balance of Ni and unavoidable impurities, in which a difference of crystal orientations is 8 degrees or less.

While the blade of the invention can be used for any stage of a three-stage or four-stage gas turbine, it is particularly suitable for the first stage which is exposed to the highest temperature. Conventional polycrystal blades or columnar grain blades are mainly used for the second and subsequent stages. Especially, the following composition is suitable (weight %):

| | |
|---|---|
| C: 0.03–0.1, | Cr: 5.5–7.0, |
| Co: 9–10.5, | W: 8.0–11.0, |
| Re: 1.0–3.5, | Mo: 0.3–1.0, |
| Ta: 3.0–4.0, | Al: 5.0–6.0, |
| Ti: 0.5–1.0, | Hf: 0.5–1.0, | one or both of boron and Zr: 0.005–0.025, and balance: Ni and unavoidable impurities.

Preferably, the blade for the gas turbine of the invention should be subjected to a solution treatment for 2 to 60 hours in a temperature range not less than solvate temperature of the γ'-phase of the alloy after casting and not more than the incipient melting temperature, and further subjected to a heat treatment at 1000° to 1150° C. for 4 to 20 hours and at 800° to 920° C. for 8 to 100 hours.

A manufacturing method of a blade for a gas turbine of the invention comprises the steps of setting a mold including a ceramic core on a water-cooled chill plate, melting a master ingot and pouring the molten metal into the preheated mold, withdrawing the mold from the heating furnace at a high temperature so as to successfully effect unidirectional solidification from the blade portion toward the root portion, thereby forming the blade portion of a single crystal, and withdrawing the mold with respect to the root portion at a higher speed than the withdrawal speed of the mold with respect to the blade portion so as to unidirectionally solidify the root portion.

The withdrawal speed of mold in producing the single crystal should preferably be 15 cm/hr or less, and the withdrawal speed of mold in producing the columnar grains should preferably be 20 to 45 cm/hr or less. Especially, the former should be made higher so long as the single crystal can be produced. However, considering the yield, about 10 cm/hr is preferred. When the latter exceeds 50 cm/hr, crystal orientations of the columnar grains have more than 10 degrees therebetween or the columnar grains become an equiaxed structure, and, consequently, 45 cm/hr or less is preferred. In order to limit a difference of the crystal orientations to 8 degrees or less, the higher the speed is, the better. Therefore, 30 to 45 cm/hr is preferred.

The invention provides an article of a unidirectionally solidified casting consisting of a single crystal and columnar grains integrally connected with each other in which a difference of crystal orientations perpendicular to a direction of the solidification of the single crystal and columnar crystals is 8 degrees or less, and the article can be used for purposes other than a moving blade for a gas turbine.

The invention provides a blade for a gas turbine, which is formed of an integral casting and which comprises a blade portion, a platform having a flat portion connected to the blade portion, a shank portion connected to the platform, projection fins on both sides of the shank portion, and a dovetail connected to the shank portion, wherein the blade portion including its root portion connected to the platform, the platform and a part of the shank portion are of a continuous single crystal structure, and wherein the rest of the blade is of a unidirectionally solidified columnar grain structure, and wherein a continuous integral coolant passage is provided in the blade from the dovetail to the blade portion, with the casting essentially consisting of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni, in which one or both of the carbon content and the boron and Zr content are within a range defined by A (C=0.20% B+Zr= 0%), B (C=0.03%, B+Zr=0%), C (C=0% B+Zr=0.01%), D (C=0%, B+Zr=0.035%) and E (C=0.1%, B+Zr=0.025%), and with the casting having a structure in which γ'-phases are precipitated in γ-phase matrix, and a difference of crystal orientations of the γ-phase is 2 to 6 degrees.

The invention provides a gas turbine for revolving blade by striking the combustion gas compressed in a compressor through vanes against has blades embedded in disks, wherein the gas turbine has three or more stages of turbines, and wherein each of the first-stage blades is formed of an integral casting and comprises a blade portion, a platform having a flat portion connected to the blade portion, a shank portion connected to the platform, projection fins on both sides of the shank portion, and a dovetail connected to the shank portion. The blade portion, including its root portion, connected to the platform, the platform and a part of the shank portion are of a continuous single crystal structure, and the rest of the blade is of a unidirectionally solidified columnar grain structure.

The invention provides the above-described gas turbine, wherein the temperature of the combustion gas is 1,500° C. or more, the gas turbine has three stages or more of the turbines, the temperature of combustion gas at the inlet of the first stage of the blades is 1,300° C. or more, the overall length of the blades of the first stage is 200 mm or more, wherein each of the first-stage blades is formed of an integral casting, the blade portion is of a single crystal structure and the rest other than the single crystal structure region including the blade portion is of a unidirectionally solidified columnar grain structure, and wherein the power generation capacity is 50,000 KW or more.

The invention provides a gas turbine in which rotary blades are rotated by combustion gas compressed in a compressor and jetted through stationary vanes against the blades which are embedded in turbine disks, wherein the temperature of the combustion gas is 1,500° C. or more, and with the gas turbine having three or more of the turbine stages. The temperature of the combustion gas at the inlet of the first stage of the turbine blades is 1,300° C. or more, with the overall length of the blades of the first stage being 200 mm or more. Each of the first-stage blades is formed of an integral casting, which comprises a blade portion, a platform having a flat portion connected to the blade portion, a shank portion connected to the platform, projection fins on both sides of the shank portion, and a dovetail connected to the shank portion. The blade portion including its root portion connected to the platform, the platform and a part of the shank portion are of a continuous single crystal structure and the rest of the blade except for the fins is of a unidirectionally solidified columnar grain structure. The casting essentially consists of, by weight, 0.03 to 0.1% C, 5.5 to 9.0% Cr, 8.5 to 10.5% Co, 8 to 11% W, 1.0 to 3.5% Re, 0.3 to 1.0% Mo, 3 to 4% Ta, 5 to 6% Al, 0.5 to 1.0% Ti, 0.5 to 1.0% Hf, 0.005 to 0.025% one or both of boron (B) and Zr, and the balance of Ni and unavoidable impurities. The casting has a structure in which γ'-phases are precipitated in γ-phase matrix, a difference of crystal orientations of γ-phase of said single crystal and γ-phase of the columnar grain is 8 degrees or less, with the power generation capacity being 50,000 KW or more.

The invention provides a combined power generation plant system comprising a gas turbine driven by the combustion gas which flows at a high speed, an exhaust heat recovery boiler to obtain steam from the combustion gas exhausted from the gas turbine, a steam turbine driven by the steam, and a power generator driven by the gas turbine and the steam turbine. The gas turbine includes three or more-stages of blades, with the temperature of the combustion gas at the inlet of the first-stage blades being 1,300° C. or more, the temperature of the exhausted combustion gas at the outlet of the turbine being 560° C. or more, and with a steam of 530° C. or more being obtained by the exhaust heat recovery boiler. The steam turbine is of a high-and-low pressure integrated type, with the temperature of the steam fed to a first stage of blades of the steam turbine being 530° C. or more, the power generation capacity of the gas turbine being 50,000 KW or more, the power generation capacity of the steam turbine being 30,000 KW or more, and the total thermal efficiency being 45% or more.

The invention provides a combined power generation plant system comprising a gas turbine driven by the combustion gas which flows at a high speed, an exhaust heat recovery boiler to obtain steam from the combustion gas exhausted from the gas turbine, a steam turbine driven by the steam, and a power generator driven by the gas turbine and the steam turbine. The gas turbine includes three or more-stages of blades, with the temperature of the combustion gas at the inlet of the first-stage blades being 1,300° C. or more, the temperature of the exhausted combustion gas at the outlet of the turbine being 560° C. or more, and is steam of 530° C. or more is being obtained by the exhaust heat recovery boiler. The steam turbine is of a high-and-low pressure integrated type, with the temperature of the steam fed to a first-stage of blades of the steam turbine being 530° C. or more, the power generation capacity of the gas turbine being 50,000 KW or more, the power generation capacity of the steam turbine being 30,000 KW or more, and with the total thermal efficiency being 45% or more. The overall length of the first-stage blades is 200 mm or more. Each of the first-stage blades is formed of an integral casting, which comprises a blade portion, a platform having a flat portion connected to the blade portion, a shank portion connected to the platform, projection fins on both sides of the shank portion, and a dovetail connected to the shank portion. The blade portion including its root portion connected to the platform, the platform and a part of the shank portion are of a continuous single crystal structure, and the rest of the blade except for the fins is of a unidirectionally solidified columnar grain structure. The casting essentially consists of, by weight, 0.03 to 0.1% C, 5.5 to 9.0% Cr, 8.5 to 10.5% Co, 8 to 11% W, 1.0 to 3.5% Re, 0.3 to 1.0% Mo, 3 to 4% Ta, 5 to 6% Al, 0.5 to 1.0% Ti, 0.5 to 1.0% Hf, 0.005 to 0.025% one or both of boron (B) and Zr, and the balance of Ni and unavoidable impurities, the casting has a structure in which γ'-phases are precipitated in γ-phase matrix, and a difference of crystal orientations of γ-phase of the single crystal and γ-phase of the columnar grains is 8 degrees or less.

DETAILED DESCRIPTION OF THE INVENTION

Figure 1:
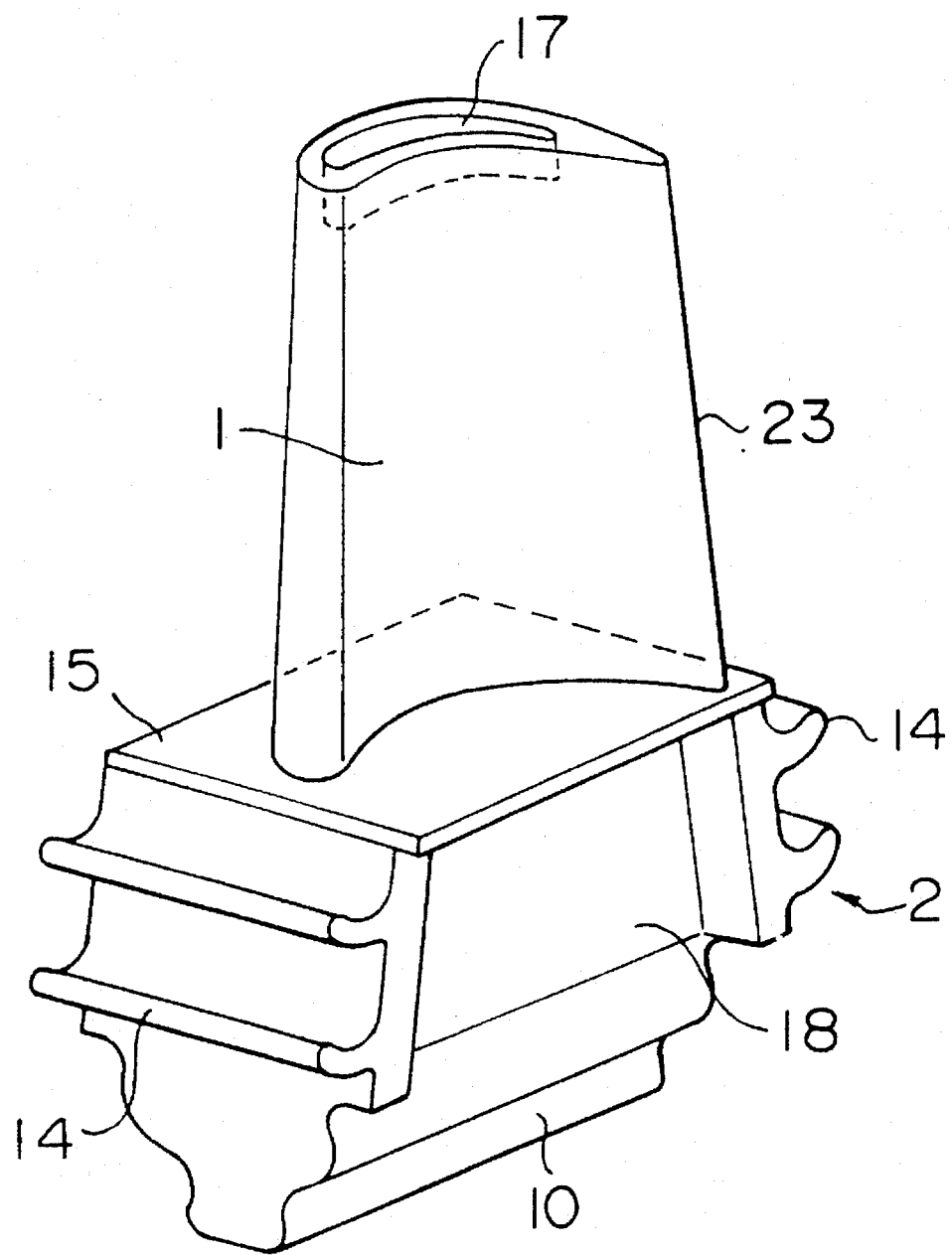
FIG. 1 is a perspective view showing a blade having a single crystal structure for a gas turbine according to the invention.

The moving blade for the gas turbine of the invention has a blade portion of a single crystal structure, with the remainder of the blade other than the single crystal structure region being of a unidirectional solidified columnar grains structure. The difference of crystal orientations of adjacent columnar crystals is made as small as possible, and particularly, the difference is limited to 8° or less. Thus, even if amounts of grain boundary strengthening elements are decreased, a columnar grain blade in which intergranular cracking is not generated during casting can be obtained, and substantially the same level of strength as a single crystal blade can be maintained. Moreover, since the amounts of grain boundary strengthening elements are decreased, the melting point of the eutectic structure formed during casting is raised to increase the temperature of a solution heat treatment, thereby enabling a heat treatment of dissolving precipitated γ'-phases into γ-phase of the base. Therefore, a columnar grain blade having a high creep strength can be obtained. In contrast, if the difference of crystal orientations exceeds 10 degrees, the strength is drastically decreased to about 10 to 20% of the strength of the single crystal blade.

In order to improve a high-temperature strength of the material, a solution heat treatment after casting is effective. In the solution heat treatment, γ'-phases precipitated after solidification are fully dissolved into the base so that the size and configuration of the precipitated γ'-phases can be made the most suitable in the subsequent aging heat treatment, thus improving the high-temperature strength.

However, large amounts of grain boundary strengthening elements such as boron (B), carbon (C), Zr, Hf and so forth must be added to an alloy used for the conventional columnar grain blade so as to prevent cracks in the longitudinal direction along grain boundaries during casting. The grain boundary strengthening elements not only improve the strength of crystal grain boundaries but also partially segregate between branches of dendrite to lower the melting point of the segregated portion by a remarkable degree. In the case of a Ni-base superalloy, the segregated portion forms eutectic structure and generates coarse eutectic γ'-phase during solidification. The eutectic structure and the eutectic γ'-phase formed have the lowest melting point within the alloy structure. When temperature is elevated to perform a solution heat treatment, the eutectic structure melts at first. Therefore, temperature of solution heat treatment could not be made high enough so that solution heat treatment of the alloy used for the conventional columnar grain blade was not sufficient. As a result, the strength of the conventional alloy could not be improved.

In an alloy of a single crystal without grain boundary strengthening elements, the elements are regarded as impurities, and their content is made as low as possible. Consequently, the melting point of eutectic γ'-phase is increased to enable a complete solution heat treatment. Therefore, the single crystal alloy exhibits an excellent high-temperature property which is 40° to 50° C. higher than that of the conventional columnar grain materials, and is employed for a moving blade of a jet engine for an aircraft. However, the single crystal alloy contains grain boundary strengthening elements of an amount as small as possible, and therefore it is extremely weak when grain boundaries are formed. If irregular crystals having different crystal orientations are present, cracks are easily formed at grain boundaries. Normally, when grain boundaries are present, an alloy is weakened to such a degree that cracks are formed by mere cooling after casting. Therefore, the cast blade of the single crystal alloy must be of a complete single crystal with no irregular crystals.

The function of each of the elements included in the Ni-base superalloy which constitutes the blade for the gas turbine will now be described.

Carbon dissolves in matrix or grain boundaries in particular and forms carbides to improve high-temperature tensile strength. However, if it is added excessively, the melting point of grain boundaries is lowered, thereby deteriorating high-temperature strength and toughness. Consequently, an appropriate additive amount of carbon is in a range of 0.05 to 0.2%, preferably 0.03 to 0.1%.

Co dissolves in matrix to improve high temperature strength and also contributes to improvement of hot corrosion resistance. If it is added excessively, it promotes precipitation of harmful intermetallic compounds, thereby deteriorating high-temperature strength. An appropriate additive amount of Co is 10.5% or less, preferably 9 to 10.5%.

Cr improves hot corrosion resistance. However, if it is added excessively, it causes precipitation of harmful σ-phase and coarsening of carbides, thereby deteriorating high-temperature strength. An appropriate additive amount of Cr is in a range of 5 to 14%, preferably 5.5 to 9%.

Al and Ti contribute to improvement of high-temperature strength by forming γ'-phase, i.e., $Ni_3(Al, Ti)$, which is a strengthening factor of the Ni-base alloy. Appropriate additive amounts of Al and Ti are, respectively, in ranges of 4.0 to 7.0 % and 0.5 to 5.0%, and preferably 5 to 6% of Al and 0.5 to 1.0 % of Ti.

Nb, Ta and Hf dissolve in γ'-phase which is a strengthening factor, and improve high-temperature strength of the alloy. However, if they are added excessively, they segregate at grain boundaries and reduce the strength of the alloy. Appropriate additive amounts of Nb, Ta and Hf are, respectively, 3% or less, 12% or less and 2% or less, and preferably 0.2 to 3.0% of Nb, 3 to 4% of Ta and 0.5 to 1.0% of Hf.

Zr and boron (B) strengthen grain boundaries and improve high-temperature strength of the alloy. However, if Zr and boron (B) are added excessively, ductility and toughness are reduced, and the melting point of grain boundaries is lowered, thereby deteriorating high temperature strength of the alloy. Appropriate additive amounts of Zr and B are, respectively, up to 0.035% and up to 0.035%. Preferably, considering the relationship with carbon content, they should be within a range defined by A (C=0.20%, B+Zr=0%), B (C=0.05%, B+Zr=0 % C (C=0%, B+Zr=0.01%), D (C=0%, B+Zr=0.035%) and E (C=0.1%, B+Zr=0.025%), or one or both of boron (B) and Zr should be 0.005 to 0.025%.

W (tungsten) and Mo dissolve in γ-phase of the matrix and strengthen the alloy, and W and Mo are particularly effective for improving long-term strength of the alloy. However, if W and Mo are added excessively, there is a precipitation of a harmful phase such as σ-phase, thereby deteriorating strength of the alloy. Appropriate additive amounts of W and Mo are, respectively, 2 to 15% and 6.0% or less, and preferably 8.0 to 11.0% of W and 0.3 to 1.0% of Mo.

Re improves hot corrosion resistance of the alloy. However, if Re exceeds a certain amount, the effect is saturated, and ductility and the toughness of the alloy are degraded. An appropriate additive amount of Re is 4% or less, and preferably 2.5 to 3.5%. In the case where a difference of crystal orientations of the single crystal is 8 degrees or less, suitably there is no grain boundary in the Ni-base superalloy as the single crystal. If a difference of crystal orientations of columnar grains is 15 degrees or less, a satisfactory strength can be obtained as the columnar grains.

EXAMPLE 1

Figure 2:
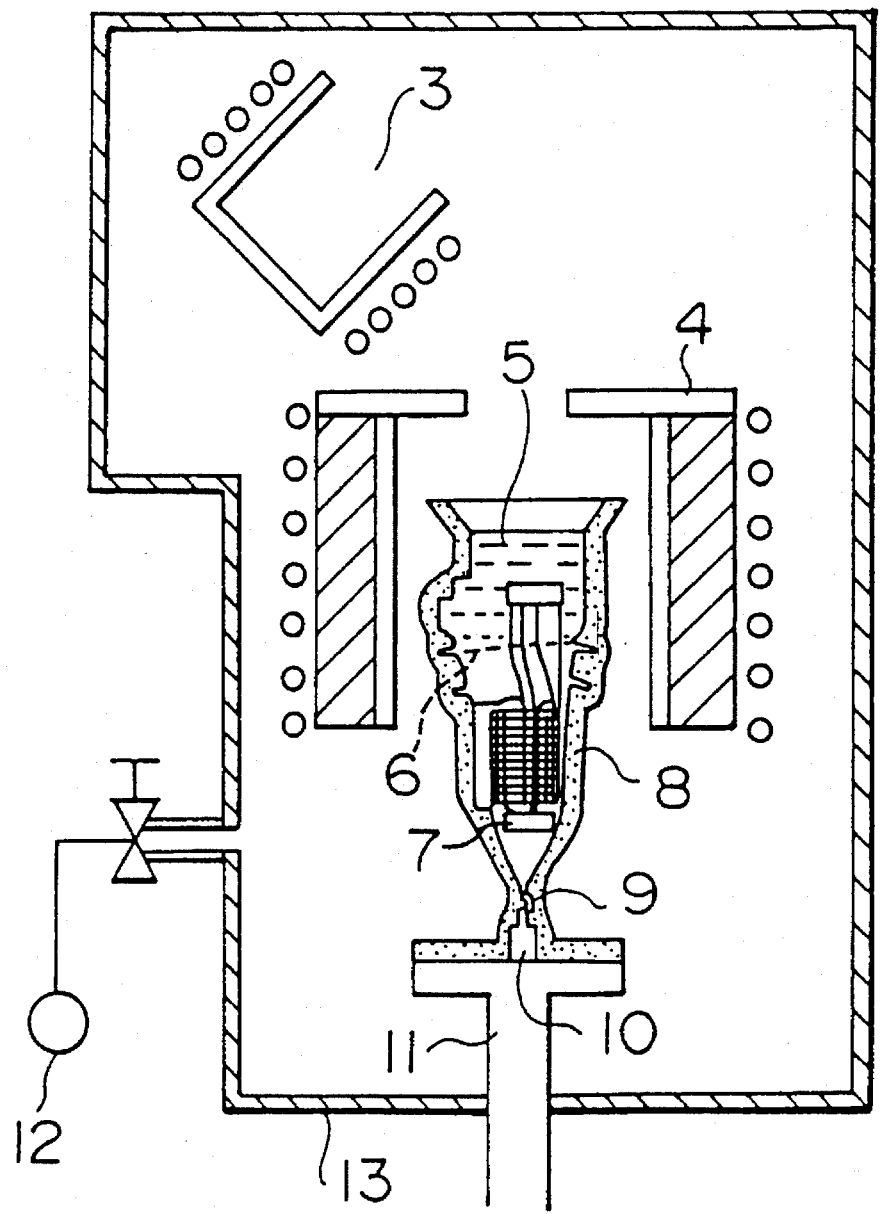
FIG. 2 is a structural diagram schematically showing a manufacturing method of the blade for the gas turbine according to the invention.

As shown in FIG. 2, a ceramic mold 8 mainly composed of alumina was first fixed on a water-cooled copper chill plate 11, and was set in a mold heating furnace 4 so that the ceramic mold 8 was heated to a melting point of an Ni-base superalloy or higher temperature. Subsequently, the molten Ni-base superalloy was poured in the ceramic mold 8, and then, the water-cooled copper chill plate 11 was withdrawn downwardly so as to conduct unidirectional solidification of the alloy. In the unidirectional solidification, a large number of crystals were generated first by a starter 10. Next, only one crystal was selected by a selector 9. The one selected crystal was enlarged in an enlarging portion, and a blade portion was solidified at a withdrawal speed of 10 cm/h, to thereby form it of a single crystal. After the blade portion solidified to a single-crystal, the remaining portion was not grown into a single crystal but formed into columnar grains by increasing the withdrawal speed of the mold to 40 cm/h after a position of a platform 15. According to this method, a columnar grain blade comprising a blade portion of a single crystal structure and the remaining portion of a columnar grain structure was obtained. The single crystal structure of the blade portion does not suddenly and entirely change to the columnar grains structure at the platform, but the platform connected to the blade portion and an adjoining part of the shank portion are of the single crystal structure, while a peripheral region of the section of the platform which is just connected to the blade portion, the rest of the shank and the dovetail are of the columnar grains structure. In this case, the columnar grains were grown from the single crystal of the blade portion serving as the seed so that a difference in orientations of the columnar grains could be made as small as about 5°. The mold heating furnace 4 was maintained at a high temperature until the ceramic mold 8 was completely withdrawn and the solidification was finished. The above-described melting and solidifying processes were both carried out under vacuum. Table 1 shows casting conditions of the invention blade, and Table 2 shows a composition of the Ni-base superalloy used in casting. After casting, the blade cast by the foregoing method was subjected to a solution heat treatment at a temperature of 1260° to 1280° C. under vacuum for 2 to 60 hours, and precipitated γ'-phases formed in the cooling process after solidification was changed into γ-phase. Thereafter, the blade was subjected to an aging heat treatment at a temperature of 1000° to 1150° C. for 4 to 20 hours and at a temperature of 800° to 950° C. for 8 to 100 hours, thereby precipitating γ'-phases of the average size of 0.3 to 2 μm in γ-phase of the matrix.

TABLE 1

| PREHEATING TEMPERATURE OF MOLD | 1540° C. |
|---|---|
| POURING TEMPERATURE | 1550° C. |
| MOLD WITHDRAWAL SPEED | 10 cm/h AT BLADE PORTION; 40 cm/h FROM A PLATFORM POSITION |
| MOLD MATERIAL | ALUMINA CERAMIC MOLD |

TABLE 2

| C | 0.05–0.1 | Cr | 5.5–7.0 |
|---|---|---|---|
| Co | 9.0–9.5 | W | 8.0–9.0 |
| Re | 2.8–3.1 | Mo | 0.3–0.7 |
| Ta | 3.0–4.0 | Al | 5.5–6.0 |
| Ti | 0.5–0.9 | Hf | 0.7–1.0 |
| B | 0.005–0.01 | Zr | 0.005–0.01 |
| Ni | BALANCE | — | — |

A thermocouple was inserted into the mold 8 at a zone corresponding to the platform 15, and a temperature of the zone was measured. When the temperature reached the solidifying temperature, the withdrawal speed of the mold was changed. A partition plate of graphite was provided under the heating furnace 4, and a water-cooled copper pipe was wound in a spiral form around a lower portion of the partition plate, so as to cool the mold.

The blade obtained according to the above described method had a blade portion 1 of a single crystal structure, and a portion 2 of the blade under the platform 15 was a columnar grain structure. Air-cooled fins 14 were formed of grains having a diameter of about 10 mm which could not be called columnar grains. Although the surface of a shank 18 was a columnar grain structure, large columnar grains which had grown from the single crystal of the blade portion 1 and gradually reduced into small columnar grains were formed inside of the shank. The width of the columnar grains on the surface was 5 to 10 mm, and the average width was 5 to 6 mm.

Figure 3:
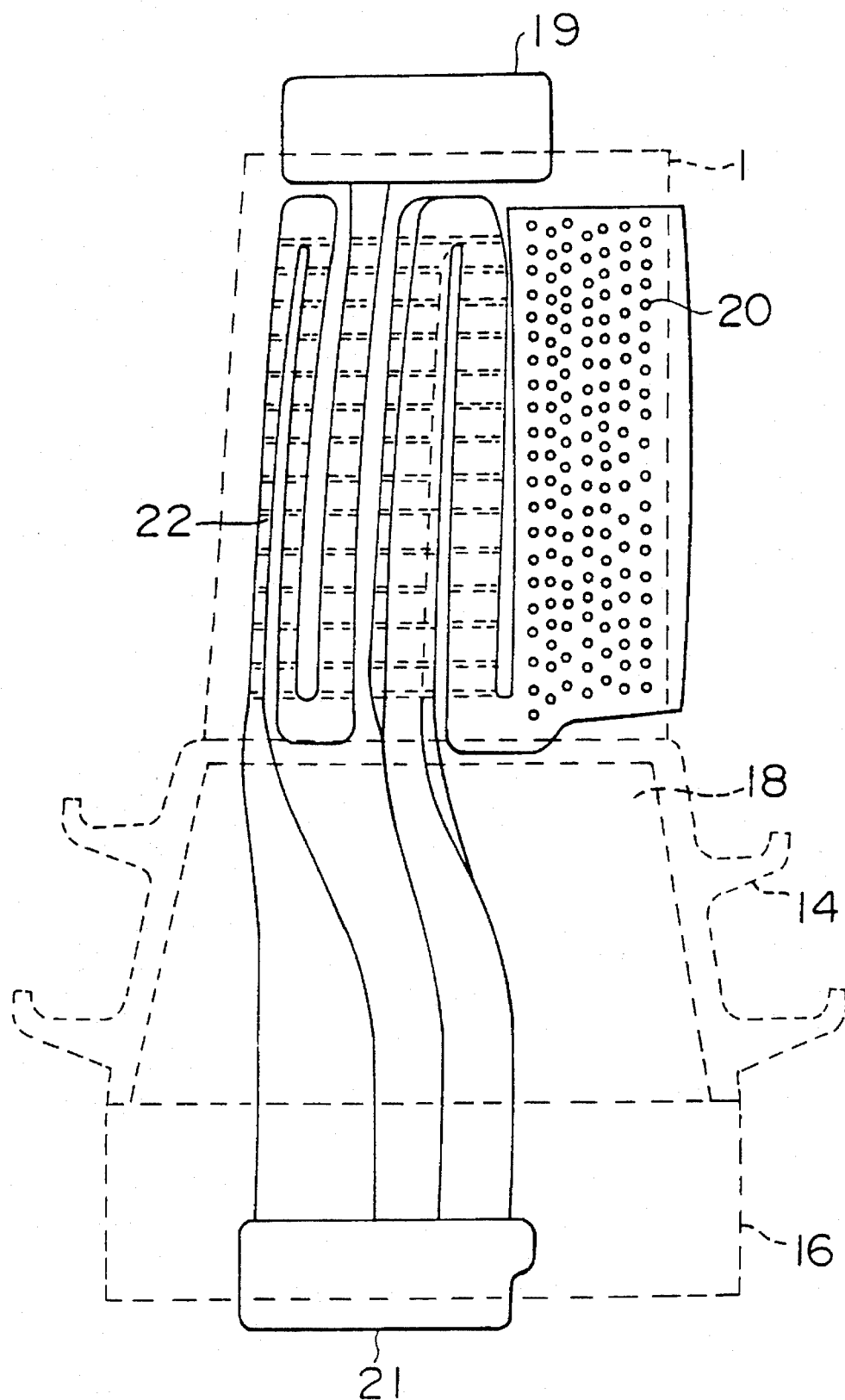
FIG. 3 is a plan view showing a core of the blade for explaining the positional relationship between the core and the moving blade in one embodiment of the invention.

The blade of the embodiment FIG. 3 is hollow so as to enable the blade to cool itself. Although the air is used as a cooling medium, steam cooling can also be applied. The cooling air is supplied from a core 21 of a dovetail 16 and divided into a flow discharged from a distal end portion 17 of the blade and a flow discharged from a trailing edge 23 of the blade.

The core includes holes 20, and two blade surfaces are connected with each other by these holes. The trailing edge 23 has a slit-like discharge port of the cooling air. The core includes holes 22 filled with molten metal 5.

In the embodiment of FIG. 3, the length of the blade portion 1 is about 100 mm, and the length of the remaining portion of the blade under the platform is 120 mm.

Figure 4:
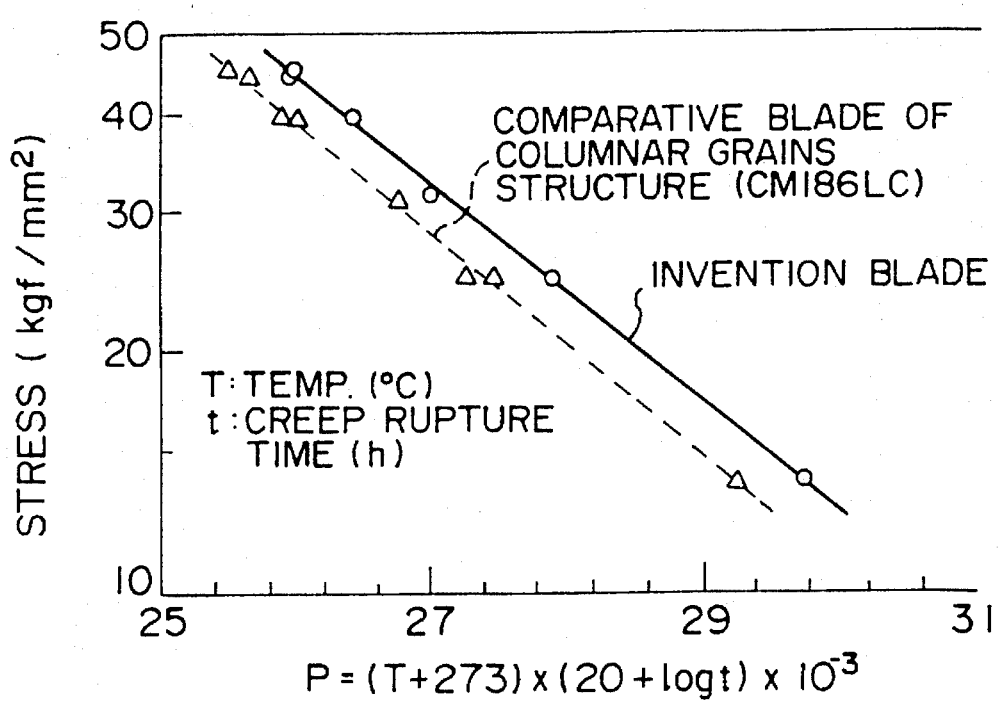
FIG. 4 is a graph for comparing a high-temperature strength of the columnar grain blade obtained according to the invention and a high-temperature strength of a conventional columnar grain blade.

The creep rupture strength of the blade thus obtained is shown in FIG. 4, using Larson-Miller parameter P. A commercial CM186LC alloy of columnar grains was used as a comparative material. The invention blade was single-crystallized and subsequently subjected to a solution heat treatment and an aging heat treatment, whereas, the comparative blade having the conventional columnar grain structure was only subjected to an aging heat treatment. A temperature capability of the invention blade with respect to the creep at a stress of 14.0 kgf/mm$^2$ for 100,000 hours was improved by about 20° C. as compared with the comparative blade. The commercial alloy had substantially the same composition as shown in Table 2 except for 0.016% B, 0.016 % Zr and 0.15% carbon.

EXAMPLE 2

The blade of the invention could be subjected to a solution heat treatment because the melting point of the eutectic structure of the alloy was raised by controlling amounts of carbon (C), boron (B) and Zr. A method of raising the melting point of the eutectic structure will now be described.

Figure 5:
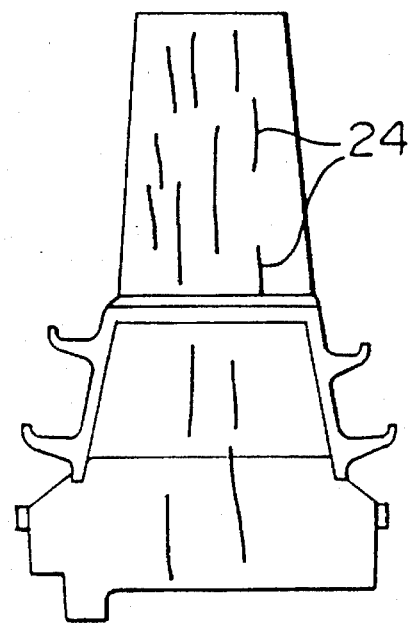
FIG. 5 is a drawing illustrative of a condition of intergranular cracking which were observed in a conventional columnar grain blade manufactured by a unidirectional solidification method.

A conventional alloy containing grain boundary strengthening elements, which contains large amounts of C, B, Zr, Hf and so forth, could not be subjected to a solution heat treatment. Therefore, using a Ni-base alloy essentially consisting of, by weight,

| | |
|---|---|
| Cr: 5.0–14.0%, | Co: 0–12.0%, |
| W: 5.0–12.0%, | Re: 0–3.5%, |
| Mo: 0.5–3.0%, | Ta: 3.0–7.0%, |
| Al: 4.0–6.0%, | Ti: 0.5–3.0%, |
| Hf: 0–2.0% | | a ratio of the carbon content and the "Zr+B" content of the alloy was changed, and the relationship between the melting point of the eutectic structure and the solidus temperature of precipitated γ'-phases was investigated. As a result, it was found that when the carbon content was 0.1% or less and the "B =Zr" content was 0.025% or less, precipitated γ'-phases could dissolve into the base phase without incipient melting of the eutectic structure. However, with regard to a Ni-base superalloy containing 0.1% or less of carbon and total 0.025% or less of "B+Zr", when a unidirectionally solidified blade having a columnar grain structure was cast intergranular crackings generated. FIG. 5 illustrates intergranular cracking of a blade having a columnar grain structure manufactured according to the conventional unidirectional solidification method. That is to say, if a columnar grain structure blade was manufactured of the alloy whose carbon content was 0.1 weight % or less and "B+Zr" content was 0.025 weight % or less according to the conventional unidirectional solidification method, crackings generated at grain boundaries, and consequently, the blade could not be provided as a product.

Figure 6:
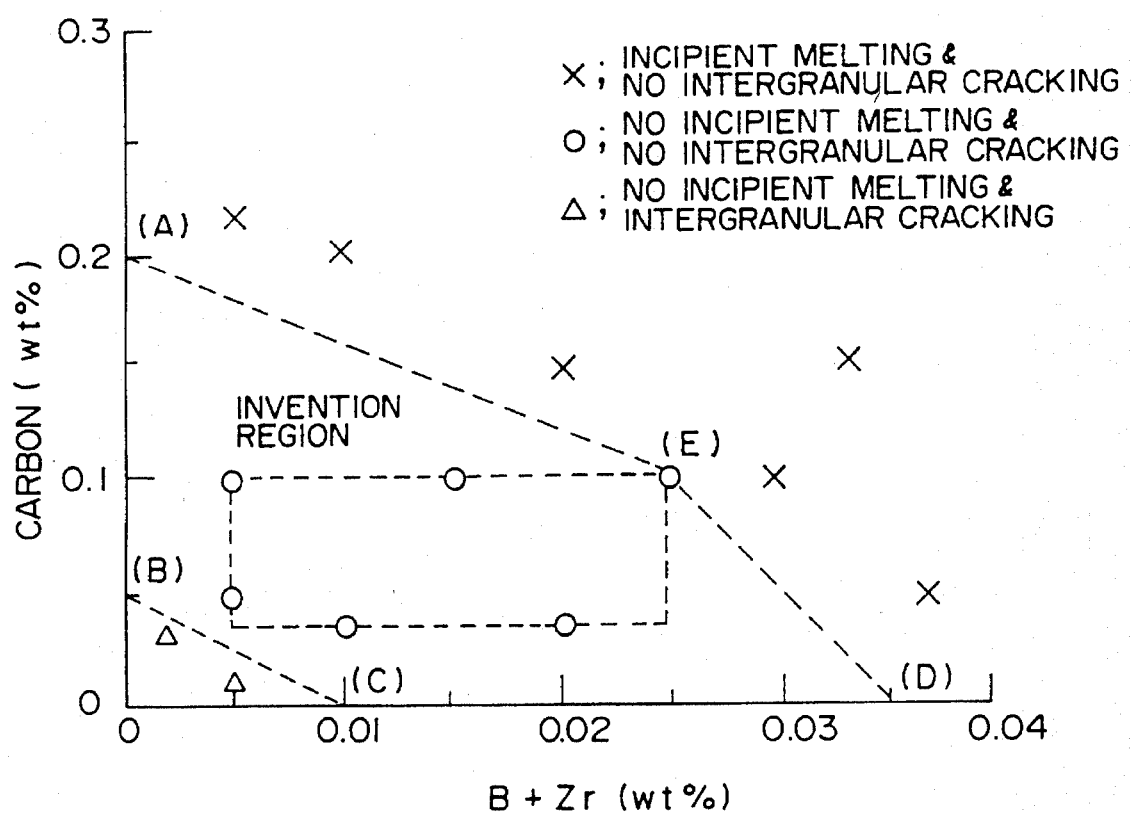
FIG. 6 is a characteristic graph illustrative of the relationship between the carbon content and the "B+Zr" content by which precipitated γ'-phases can dissolve into γ-phase without incipient melting of the alloy, and their relationship with intergranular cracking.

The relationship of a difference in crystal orientations of columnar grains, the carbon content and the "Zr+B" content of the alloy, and intergranular cracking was investigated. When the difference in crystal orientations of columnar grains was within 8°, and when the carbon content was 0.03% or more and the "Zr=B" content was 0.005% or more by weight, a favorable columnar grain blade without intergranular cracking could be obtained. However, when the difference in crystal orientations of columnar grains was 8° or more, intergranular cracking was generated even if the carbon content was 0.03% or more and the "Zr+B" content was 0.005% or more. When the carbon content was 0.03% or less, intergranular cracking was generated even when the difference in crystal orientations of columnar grains was within 8°. The foregoing results are shown in FIG. 6. It should be noted that when the difference in crystal orientations of columnar grains is within 6°, a blade without incipient melting and no intergranular cracking can be obtained from an alloy within a range defined by A (C=0.20%, B+Zr=0%), B (C=0.05%, B+Zr=0%), C (C=0%, B+Zr=0.01%), D (C=0%, B+Zr=0.035%) and E (C=0.1%, B+Zr=0.025%). A preferable range is within a polygon defined by the straight lines successively connecting the five points A,B, C, D and E on the graph of FIG. 6 where A (C=0.2%, B+Zr=0%), B (C=0.04%, B+Zr=0.002%), C (C=0%, B+Zr=0.01%), D (C=0%, B+Zr=0.02%) and, E (C=0.1%, B+Zr=0.02%).

In order to prevent generation of intergranular cracking in the alloy whose carbon content is 0.1 weight % or less and "B+Zr" content is 0.025 weight % or less, the difference in crystal orientations must be within 8°. In the conventional unidirectional solidification method, however, lateral crystal orientations of columnar grains were at random and could not be controlled to be within 8°. On the other hand, in the method according to the present invention, the blade portion was formed of a single crystal, and columnar grains were grown from the single crystal serving as a seed, so that the difference in orientations of columnar crystals could be within 8°. That is to say, when the blade portion was formed of a single crystal and the other portions were formed of columnar grains having an orientation difference within 8° as in the invention, a favorable columnar grain blade without intergranular cracking could be obtained even if the carbon content was 0.1 weight % or less and the "B+Zr" content was 0.025 weight % or less. Substantially the same effect was exhibited with either one or both of boron (B) and Zr.

Table 3 shows comparison results of characteristics of a columnar grain blade and a single crystal blade according to the conventional method and a blade according to the present invention when the blades were manufactured to have a blade length of 22 cm (100 mm in the blade portion, 120 mm in the root portion). A commercial alloy was employed for casting the columnar grain blade and the single crystal blade.

TABLE 3

| KIND OF BLADE | CASTING TEMP. (°C.) | CASTING TIME (h) | GENERATION RATE OF INTERGRANULAR CRACKING (%) | GENERATION RATE OF DEFECTS (%) | YIELD (%) | TEMP. CAPABILITY (°C.) |
|---|---|---|---|---|---|---|
| COLUMNAR GRAINS BLADE | 1520 | 1.0 | 75 | 20 | 15 | 900 |
| SINGLE CRYSTAL BLADE | 1600 | 3.0 | 0 | 95 | 5 | 940 |
| INVENTION BLADE | 1540 | 1.5 | 0 | 30 | 70 | 920 |

Since no intergranular cracking was generated in the columnar grain blade of the invention, the yield was 70% and about five times higher than that of the blade which was 15%, and the temperature capability with respect to the creep at a stress of 14.0 kgf/mm$^2$ for 100,000 hours was increased by about 20° C.

When only the temperature capabilities were compared, the blade of the invention was inferior to the single crystal blade. However, in this invention, the other portions than the blade portion were of a columnar grain structure so that the casting time could be shortened, and that the mold heating temperature could be lowered. As a result, less reactions between the alloy with the mold occurred, and the ratio of defects was decreased, thereby improving the yield of production of blades. Therefore, the present invention provides a significantly practical columnar grains blade and a significantly practical manufacturing method. Obviously, even if an entire blade is formed of a single crystal by use of the invention alloy, no actual problems will arise although the productivity and the yield are deteriorated.

EXAMPLE 3

According to the method described in Example 1, a Ni-base superalloy having a chemical composition (weight %) shown in Table 4 was cast, and a columnar grain blade in which a blade portion was formed of a single crystal and the other portions were substantially perfectly formed of columnar grains was manufactured. A mold in this embodiment was designed in such a manner that a straight mold bypassed from a single crystal enlarging portion with respect to the projection fins as shown in FIG. 2, was formed so that the projection fins will be of columnar grains. No intergranular cracking was observed in the cast blade. The blade was subjected to a solution heat treatment at 1270° to 1285° C. for 2 to 60 hours and an aging heat treatment at 1000° to 1150° C. for 4 to 20 hours and at 800° to 950° C. for 8 to 100 hours. Temperature capabilities of the foregoing blade and a comparative sample with respect to the creep at a stress of 14.0 kgf/mm² for 100,000 hours were compared. The comparative sample was only subjected to an aging heat treatment at 1000° to 1150° C. for 4 to 20 hours and at 800° to 950° C. for 8 to 100 hours. As a result, it was found that the temperature of the blade was increased by about 15° C. In this embodiment, the difference in crystal orientations of columnar grains was about 5°.

TABLE 4

| C | 0.1–0.15 | Cr | 8.0–9.0 |
| Co | 9.5–10.5 | W | 10.0–11.0 |
| Re | 1.0–1.5 | Mo | 0.3–0.7 |
| Ta | 3.0–4.0 | Al | 5.5–6.0 |
| Ti | 0.5–1.5 | Hf | 0.7–1.0 |
| B | 0.005–0.01 | Zr | 0.005–0.01 |
| Ni | BALANCE | — | |

EXAMPLE 4

Figure 7:
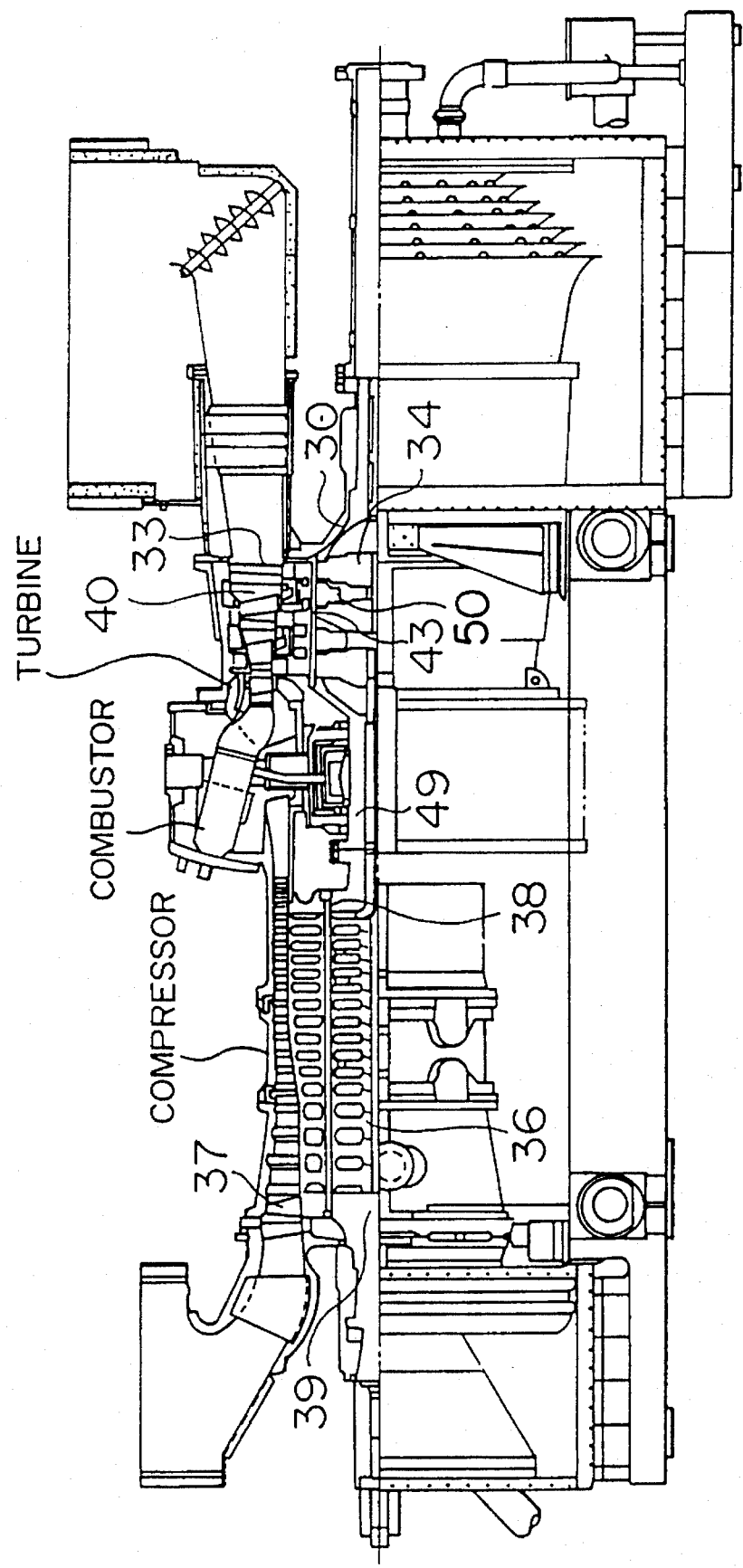
FIG. 7 is a schematic cross-sectional view of a motor portion of a gas turbine according to another embodiment of the invention.

A motor portion of a gas turbine may, as shown in FIG. 7 include a turbine stub shaft 30, a turbine blade 33 fashioned in accordance with Example 2, a turbine stacking bolt 43, a turbine spacer 50, a distant piece 49, a turbine vane 40, a compressor disk 36, a compressor blade 37, a compressor stacking bolt 38, a compressor stub shaft 39, and a turbine disk 34. The gas turbine of the invention includes seventeen stages of the compressor disk 36 and three stages of the turbine blades 33. The turbines may be a four-stage turbine. In either case, the invention alloy can be applied.

The gas turbine in the embodiment of FIG. 7 is a heavy duty type turbine. It has a single shaft, a horizontal division casing and a stacking type rotor. The compressor is a seventeen-stage axial flow compressor. The the turbine is a three-stage impulse type turbine. The first and second-stage blades and vanes are air-cooled. The combustor is a reverse flow type, and has sixteen tubular combustor portions and a slot cool. e. g. with slots in their outer peripheral sides to raise cooling efficiency when cooling air is supplied thereto.

The entirely tempered martensitic steel essentially consisting of, by weight, 0.06 to 0.15% C, 1% or less Si, 1.5 or less Mn, 9.5 to 12.5% Cr, 1.5 to 2.5% Ni, 1.5 to 3.0% Mo, 0.1 to 0.3% V, 0.03 to 0.15% Nb, 0.04 to 0.15% N (nitrogen) and the balance of Fe is used for the distant piece 49, the turbine disk 34, the spacer 50 and the stacking bolt 43. As characteristics of this embodiment, tensile strength was 90 to 120 kg/mm², 0.2% yield strength was 70 to 90 kg/mm², elongation rate was 10 to 25%, area reduction rate was 50 to 70% V-notch impact value was 5 to 9.5 kg-m/cm², creep rupture strength at 450° C. for 105 hours was 45 to 55 kg/mm².

The turbine blades 33 had three stages, and the blade manufactured in the Example 2 was used for the first stage. The compressor had a compression pressure of 14.7 and a temperature of 400° C., the temperature at the inlet of the first stage of the blades was 1,300° C., and the temperature of the gas of combustion by the combustor was at a level of 1450° C. Blades made of a polycrystal structure having substantially the same composition as the first-stage blades which have a length of 280 mm (160 mm of a blade portion and the remaining 120 mm from a platform portion) were manufactured for the second stage of the turbine moving blade 33. The third-stage blades were made of the same alloy as that of the second-stage. The blade had a poly crystal structure which had a length of 350 mm (230 mm of a blade portion and the remaining 120 mm). The third-stage blades were a solid type. A conventional precision casting method with the lost wax process was adopted.

A known Co-base alloy was used for the first to third-stages turbine vanes 40. The vanes each including a single vane portion were formed by the vacuum precision casting. The vane portion had a length equivalent to the length of the blade portion of the each blade, and included a structure of pin-fin cooling, impingement cooling and film cooling. The first-stage vanes were retained at both ends whereas the second-stage and third-stage vanes were retained at one side by the side wall. An inter-cooler was provided for the gas turbine.

50 MW of the power generation output could be obtained from the embodiment of FIG. 7, and the thermal efficiency was 33% or higher.

EXAMPLE 5

Figure 8:
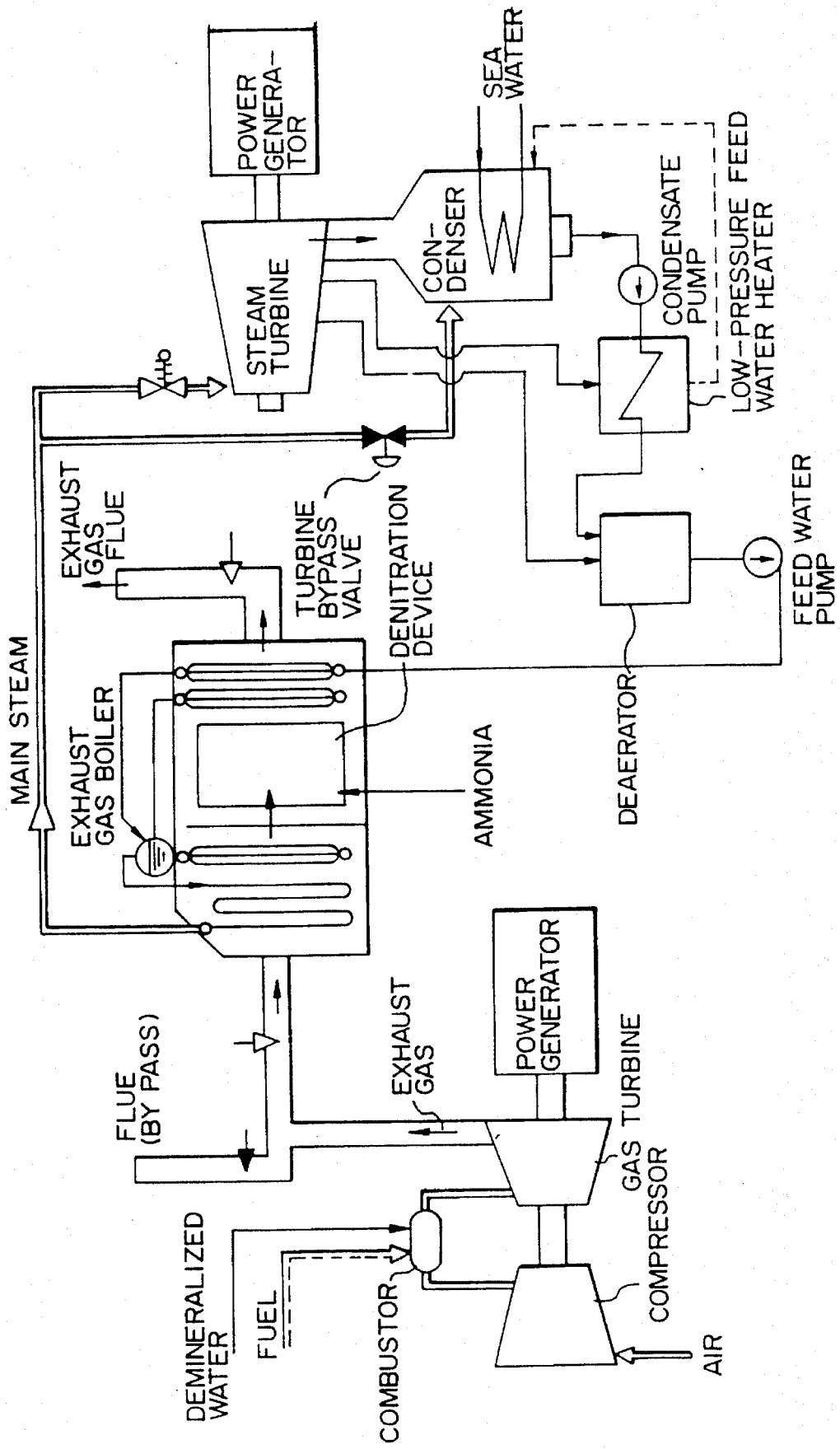
FIG. 8 is a schematic view of a single shaft type combined power generation plant according to still another embodiment of the invention.

When power generation is carried out by employing a gas turbine, it is likely that a so-called combined power generation method is employed in which, as shown in FIG. 8, the gas turbine is driven by liquefied natural gas (LNG) as a fuel, and also, a steam turbine is driven by the steam obtained by recovering energy from the exhaust gas of the gas turbine, so that a power generator is driven by the steam turbine and the gas turbine. In the combined power generation method, the following system structure enables a thermal efficiency of about 45% or more, which is higher than the thermal efficiency of the conventional system provided with a steam turbine alone which is 40%. Lately, such a combined power generation plant has been shifted from exclusive combustion of liquefied natural gas (LNG) to selective combustion of either liquefied natural gas (LNG) or liquefied petroleum gas (LPG), and mixed combustion of LNG and LPG has been realized, to thereby enable smooth operation of the plant and improve the economical effect.

First, the air is introduced to an air compressor of a gas turbine through a suction filter and a suction silencer. The air compressor compresses the air and supplies the compressed air to a low NOx combustor. In the combustor, fuel is injected into the compressed air and burned to produce high-temperature gas of 1400° C. or more. This high-temperature gas fulfills its task in the turbine, and motive power is generated.

The gas at a temperature of 530° C. or more exhausted from the turbine is supplied to an exhaust heat recovery boiler by way of an exhaust gas silencer, and the thermal energy in the exhaust gas from the gas turbine is recovered to produce high-pressure steam of 530° C. or more. The boiler is provided with a denitration device of dry ammonia catalytic reduction. The exhaust gas is discharged to the outside through a triple smoke passage combined type flue of several hundred meters. The produced high-pressure and low-pressure steam is supplied to a steam turbine composed of a high-and-low pressure integrated rotor.

The steam discharged from the steam turbine is introduced into a condenser and deaerated in a vacuum so as to be transformed into a condensed water. The condensed water is pressurized by a condensate pump and delivered as feed water to a boiler. Then, the gas turbine and the steam turbine drive a power generator from opposite ends of the shaft, thus performing power generation. In order to cool a gas turbine blade for such combined power generation, the steam used in the steam turbine is sometimes used as a cooling medium as well as the air. In general, the air is used as a cooling medium for a blade. However, because a specific heat of the steam is by far larger than that of the air, and because the steam has a light weight, the cooling effect is superior.

According to the combined power generation system, a total of 80,000 KW power generation output composed of 50,000 KW from the gas turbine and 30,000 KW from the steam turbine can be obtained. Since the steam turbine of the embodiment is compact, it can be manufactured at a lower cost than a large-scale steam turbine having the same power generation capacity, which results in a great advantage that economical operation in accordance with a change of the generation output can be performed.

The steam turbine according to the present invention is a high-and-low pressure integrated type. The single-machine output of the turbine can be increased by raising the steam pressure at the inlet of the main steam of the high-and-low pressure integrated type steam turbine to 100 atg and by raising the temperature to 538° C. In order to raise the single machine output, it is necessary to increase the blade length of the final stage of the moving blade to 30 inches or more and to increase the steam flow rate.

The steam turbine according to the present invention includes thirteen stages or more of the blades which are embedded in the high-and-low pressure integrated type rotor shafts. The steam flows in the turbine at a high temperature of 538° C. and a high pressure of 88 atg from the steam inlet, as described above, by way of a steam control valve. The steam flows in one direction from the inlet to the final stage blades at a temperature of 33° C. at 722 mmHg and is exhausted from the outlet. Forged steel of Ni—Cr—Mo—V low alloy steel is used for the high-and-low pressure integrated type rotor shaft according to the present invention. The portion where the blades are firmly connected on a rotor shaft is disk-shaped and produced totally by cutting from the rotor shaft. The shorter the length of the blade, the longer the width of the disk portion is arranged so as to cause the least vibration.

The high-and-low pressure integrated type rotor shaft according to this embodiment essentially consists of 0.18 to 0.30% C, up to 0.1% Si, up to 0.3% Mn, 1.0 to 2.0% Ni, 1.0 to 1.7% Cr, 1.0 to 2.0% Mo, 0.20 to 0.3% V and the balance of Fe. The rotor shaft is quenched at 900° to 1050° C. by water spray cooling, and is thereafter tempered at 650° to 680° C.

The construction of the plant can be arranged as a single-shaft type which combines six sets of power generation systems, one set comprising a gas turbine, an exhaust heat recovery boiler, a steam turbine and a power generator. Also, the construction of the plant may be arranged as a multi-shaft type in which a power generator combined with a gas turbine makes one set, and six sets thereof are combined to obtain the steam from the exhaust gas and introduce it into a steam turbine and a power generator.

The combined power generation is realized by a combination of a gas turbine which can be easily started and stopped in a short time, is of a small-size, and employs a single steam turbine. Therefore, the output control can be readily effected, and the combined power generation is suitably used for an intermediate-load thermal power generator which responds to the changing demand.

The reliability of the gas turbine is remarkably enhanced due to the development of the latest technology. Further, the combined power generation plant is a system constituted of a combination of machines with small capacities. Thus, when a machine fault occurs, the damage thereof can be contained to local parts, thereby providing a highly reliable power source.

According to the present invention, a blade for a gas turbine having a high creep strength can be obtained to lengthen the durability of the blade and to increase the combustion gas temperature, thereby producing a remarkable effect that a thermal efficiency of the gas turbine and a thermal efficiency of a combined power generation plant system including the gas turbine can be improved.

Further, according to the manufacturing method of the blade for the gas turbine of the invention, the yield of the manufacture of blades can be enhanced.

What is claimed is:

1. A blade for a gas turbine, which is formed of an integral casting and comprises a blade portion, a platform having a flat portion connected to said blade portion, a shank portion connected to said platform and comprising two opposite sides, projection fins on said two sides of said shank portion, and a dovetail connected to said shank portion, wherein said blade portion comprises a root portion which is connected to said platform, and wherein said blade portion and its root portion, said platform and an adjoining part of said shank portion are of a continuous single crystal structure, and wherein the rest of the blade is of unidirectionally solidified columnar grains structure.

2. A blade for a gas turbine according to of claim 1, wherein an integral coolant passage is continuously provided in the blade from said dovetail to said blade portion.

3. A blade for a gas turbine according to claim 1, wherein said casting essentially consists of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni.

4. A blade for a gas turbine, which is formed of an integral casting and comprises a blade portion and a dovetail, by which said blade can be fixed to a rotor core of a gas turbine when said blade is assembled in a gas turbine, said dovetail being connected to said blade portion, wherein said blade portion is of a single crystal structure and said dovetail is of a unidirectionally solidified columnar grains structure, said blade being initiated to solidify from said blade portion toward said dovetail.

5. A blade for a gas turbine according to claim 4, wherein said casting essentially consists of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni.

6. A blade for a gas turbine, which is formed of an integral casting and comprises a blade portion and a dovetail, by which said blade can be fixed to a blade base of a gas turbine when said blade is assembled in a gas turbine, said dovetail being connected to said blade portion, wherein said blade portion is of a single crystal structure, said dovetail is of a columnar grains structure and a difference of crystal orientations between said blade portion and said dovetail is not greater than 8 degrees.

7. A blade for a gas turbine according to claim 6, wherein said casting essentially consists of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni.

8. A blade for a gas turbine, which is formed of an integral casting and comprises a blade portion, a platform having a flat portion connected to said blade portion, a shank portion connected to said platform and comprising two opposite sides, projection fins on said two sides of said shank portion, and a dovetail, by which said blade can be fixed to a blade base of a gas turbine when said blade is assembled in a gas turbine, said dovetail being connected to said shank portion, wherein said blade portion is of a single crystal structure, and said platform, said shank portion, said fins and said dovetail are of a columnar grains structure, and wherein a difference of crystal orientations between said blade portion, said platform, said shank portion, said fins and said dovetail is not greater than 8 degrees.

9. A blade for a gas turbine according to claim 8, wherein said casting essentially consists of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni.

10. A blade for gas turbine, formed of an alloy essentially consisting of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni, in which one or both of the carbon content and the "B and Zr" content are within a polygon defined by A (C=0.20%, B+Zr=0%), B (C=0.5%, B+Zr=0%), C(C=0%, B+Zr=0.01%), D (C=0%, B+Zr=0.035%) and E (C=0.1%, B+Zr= 0.025%), where A,B,C,D and E are points, successively connected by straight lines, on a graph illustrative of the relationship between the carbon content and the "B+Zr" content of the alloy of said blade by which precipitated γ'-phases can dissolve into γ-phase without incipient melting of the alloy, and their relationship with intergranular cracking, and wherein said blade includes columnar grains, a difference of crystal orientation of said columnar grains of said blade is 2 to 6 degrees.

11. A blade for a gas turbine, which is formed of an integral casting and comprises a blade portion, a platform having a flat portion connected to said blade portion, a shank portion connected to said platform and comprising two opposite sides, projection fins on said two sides of said shank portion, and a dovetail connected to said shank portion, wherein said blade portion comprises a root portion which is connected to said platform, and wherein said blade portion and its root portion, said platform and an adjoining part of said shank portion are of a continuous single crystal structure, wherein the rest of the blade is of a unidirectionally solidified columnar grains structure, and wherein an integral coolant passage is continuously provided in the blade from said dovetail to said blade portion, said casting being formed of an alloy essentially consisting of, by weight, up to 0.20% C, 5 to 14% Cr, 4 to 7% Al, 2 to 15% W, 0.5 to 5% Ti, up to 3% Nb, up to 6% Mo, up to 12% Ta, up to 10.5% Co, up to 2% Hf, up to 4% Re, up to 0.035% B, up to 0.035% Zr, and the balance of 58% or more Ni, in which one or both of the carbon content and the "B and Zr" content are within a polygon defined by A (C=0.20%, B+Zr=0%), B (C=0.05%, B+Zr=0%), C (C=0%, B+Zr=0.01%), D (C=0% B+Zr=0.035%) and E (C=0 1%, B+Zr= 0.025%), where A,B,C,D and E are points, successively connected by straight lines, on a graph illustrative of the relationship between the carbon content and the "B+Zr" content of the alloy of said casting by which precipitated γ'-phases can dissolve into γ-phase without incipient melting of the alloy, and their relationship with intergranular cracking, said casting having a structure in which γ'-phases precipitate in γ-phase matrix, and a difference of crystal orientations of said γ-phase being 2 to 6 degrees.

12. A gas turbine in which rotary blades are rotated by combustion gas compressed in a compressor and jetted through stationary vanes, said blades being embedded in turbine disks of said gas turbine, wherein the temperature of said combustion gas is 1,500° C. or more, said gas turbine has three or more stages of turbine blades, the temperature of said combustion gas at the inlet of said blades at a first stage is 1,300° C. or more, and the overall length of said first-stage blades is 200mm or more, wherein each of the first-stage blades is formed of an integral casting and comprises a blade portion and a dovetail, by which said blade is filed to a blade base in said gas turbine, said dovetail being connected to said blade portion, said blade portion is of a single crystal structure and said dovetail being of a unidirectionally solidified columnar grains structure, and wherein the power generation capacity is 50,000 KW or more.

13. An article made of a unidirectionally solidified casting consisting essentially of a single crystal structure and a columnar grains structure integrally connected with each other, wherein in said single crystal structure and said columnar grains structure as a whole a difference of crystal orientations perpendicular to a direction of said solidification of said single crystal and columnar grains is 8 degrees or less.

\* \* \* \* \*